United States Patent
Onoue et al.

(10) Patent No.: US 12,424,018 B2
(45) Date of Patent: Sep. 23, 2025

(54) METHOD OF FABRICATING ELECTRONIC DEVICE INCLUDING A SENSOR MODULE

(71) Applicant: Samsung Display Co., Ltd., Yongin-Si (KR)

(72) Inventors: Shinya Onoue, Hwaseong-si (KR); Dongjin Jeong, Seoul (KR); Jin Hyun, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 498 days.

(21) Appl. No.: 17/991,162

(22) Filed: Nov. 21, 2022

(65) Prior Publication Data

US 2023/0290175 A1  Sep. 14, 2023

(30) Foreign Application Priority Data

Mar. 8, 2022 (KR) .................. 10-2022-0029076

(51) Int. Cl.
*H10K 59/00* (2023.01)
*G06V 40/13* (2022.01)
*H10K 59/65* (2023.01)
*H10K 71/00* (2023.01)

(52) U.S. Cl.
CPC ......... *G06V 40/1306* (2022.01); *H10K 59/65* (2023.02); *H10K 71/00* (2023.02)

(58) Field of Classification Search
CPC ........... G06V 40/1306; G06V 40/1329; G06V 40/1318; H10K 59/65; H10K 71/00; H10K 59/873; H10K 59/00; H10K 50/841; H10K 50/844
See application file for complete search history.

(56) References Cited

U.S. PATENT DOCUMENTS

| | | | |
|---|---|---|---|
| 11,126,293 B2 | 9/2021 | Kim et al. | |
| 2017/0357842 A1* | 12/2017 | Park | C03C 17/02 |
| 2019/0326367 A1* | 10/2019 | Jung | H10K 59/65 |
| 2020/0194516 A1* | 6/2020 | Kim | G06V 40/1306 |
| 2021/0004117 A1* | 1/2021 | Kim | G06V 40/1306 |
| 2021/0181383 A1* | 6/2021 | Cho | G02B 1/14 |

(Continued)

FOREIGN PATENT DOCUMENTS

| | | |
|---|---|---|
| JP | 04-009802 | 1/1992 |
| JP | 2003-266580 | 9/2003 |

(Continued)

*Primary Examiner* — S M Sohel Imtiaz
(74) *Attorney, Agent, or Firm* — F. CHAU & ASSOCIATES, LLC

(57) ABSTRACT

A method of fabricating an electronic device includes: fabricating a display module including a display panel, a protection film disposed on the display panel, and a cover panel disposed on the protection film, wherein the cover panel has an open portion partially exposing the protection film; forming a first resin on a first region of the open portion; forming a second resin on a second region; emitting a first UV ray to the first and second resins; placing a sensor module on the first resin; pressing the sensor module such that the first and second resins fill the first and second regions and a first filling layer and a second filling layer in the first region and the second region, respectively, are formed; and emitting a second UV ray to the second filling layer in the second region to cure the second filling layer.

20 Claims, 13 Drawing Sheets

(56) References Cited

U.S. PATENT DOCUMENTS

| | | | | |
|---|---|---|---|---|
| 2021/0191552 A1* | 6/2021 | Bok | ................. | H10K 59/38 |
| 2021/0265204 A1* | 8/2021 | Lo | ................. | G03F 7/2022 |
| 2021/0350109 A1* | 11/2021 | Jin | ................. | B32B 3/02 |
| 2022/0058358 A1* | 2/2022 | Bok | ................. | G06F 3/0445 |
| 2023/0267759 A1* | 8/2023 | Ku | ................. | H10F 39/8057 |
| | | | | 345/156 |

FOREIGN PATENT DOCUMENTS

| | | |
|---|---|---|
| KR | 10-2019-0062143 | 6/2019 |
| KR | 10-2020-0034261 | 3/2020 |
| KR | 10-2020-0101176 | 8/2020 |
| KR | 10-2021-0047534 | 4/2021 |
| KR | 10-2021-0082316 | 7/2021 |
| WO | 2006/016555 | 2/2006 |

* cited by examiner

METHOD OF FABRICATING ELECTRONIC DEVICE INCLUDING A SENSOR MODULE

CROSS-REFERENCE TO RELATED APPLICATION

This U.S. non-provisional patent application claims priority under 35 U.S.C. § 119 to Korean Patent Application No. 10-2022-0029076, filed on Mar. 8, 2022, in the Korean Intellectual Property Office, the disclosure of which is incorporated by reference herein in its entirety.

TECHNICAL FIELD

The present inventive concept relates to a method of fabricating an electronic device, and more particularly, to a method of fabricating an electronic device including a sensor module.

DISCUSSION OF THE RELATED ART

Generally, an electronic device is configured to perform various functions such as displaying image information to a user and sensing an input from the user to thereby allow for communication with the user.

Recently, the electronic device is configured to have a function of sensing a user's biometric information. There are various biometric information recognition methods, such as a capacitance sensing method, which generally includes sensing a change in electrostatic capacitance between electrodes, an optical sensing method, which generally includes sensing an incident light by using an optical sensor, and an ultrasonic sensing method, which includes sensing vibrations by using a piezo-electric device.

Currently, a positioning of a sensing module, which is for sensing the biometric information, in an electronic device has been under development.

SUMMARY

According to an embodiment of the present inventive concept, a method of fabricating an electronic device includes: fabricating a display module including a display panel, a protection film disposed on the display panel, and a cover panel disposed on the protection film, wherein the cover panel has an open portion partially exposing the protection film; forming a first resin on a first region of the open portion; forming a second resin on a second region, which is adjacent to the first region; emitting a first UV ray to the first and second resins; placing a sensor module on the first resin; pressing the sensor module such that the first and second resins fill the first and second regions and a first filling layer and a second filling layer in the first region and the second region, respectively, are formed; and emitting a second UV ray, which has an intensity different from that of the first UV ray, to the second filling layer in the second region to cure the second filling layer.

In an embodiment of the present inventive concept, the first and second resins exhibit substantially the same curing performance.

In an embodiment of the present inventive concept, the first and second resins include the same material as each other.

In an embodiment of the present inventive concept, each of the first and second resins is a UV delay curable resin.

In an embodiment of the present inventive concept, the first and second resins include epoxy or silicone.

In an embodiment of the present inventive concept, the second UV ray has an intensity higher than that of the first UV ray.

In an embodiment of the present inventive concept, the first UV ray has an intensity of about 200 $mJ/cm^3$ to about 2000 $mJ/cm^3$, and the second UV ray has an intensity of about 4000 $mJ/cm^3$ or higher.

In an embodiment of the present inventive concept, the method further includes exerting a specific pressure on the second filling layer, after the emitting of the second UV ray to the second filling layer to cure the second filling layer.

In an embodiment of the present inventive concept, the exerting of the specific pressure on the second filling layer includes exerting a pressure of about 1 atm to about 5 atm on the second filling layer at a process temperature of about 25° C. to about 60° C.

In an embodiment of the present inventive concept, the exerting of the specific pressure on the second filling layer includes exerting a pressure of about 0 atm to about 1 atm on the second filling layer at a process temperature of about 60° C. or higher.

In an embodiment of the present inventive concept, the forming of the first and second resins is performed such that the first and second resins are formed to be spaced apart from each other.

In an embodiment of the present inventive concept, the second filling layer, which is cured by the second UV ray, and the first filling layer are connected to form a single resin layer.

In an embodiment of the present inventive concept, the second filling layer includes a first surface, which is disposed on an inner side surface of the open portion of the cover panel, a second surface, which is disposed on a rear surface of the protection film, a third surface, which is disposed on a side surface of the sensor module, and a fourth surface, which is opposite to the second surface.

In an embodiment of the present inventive concept, the fourth surface of the second filling layer has an inclined surface profile.

In an embodiment of the present inventive concept, the fourth surface of the second filling layer has a structure that is concavely curved toward the protection film.

In an embodiment of the present inventive concept, the sensor module includes a fingerprint recognition sensor that is configured to recognize a fingerprint by using an ultrasonic wave.

In an embodiment of the present inventive concept, when a frequency of the ultrasonic wave sent to the fingerprint recognition sensor is about 1 MHz to about 100 MHz, each of the first and second filling layers has a modulus of about 1 GPa or higher.

In an embodiment of the present inventive concept, each of the first and second resins has a light-blocking property.

In an embodiment of the present inventive concept, the protection film does not have a light-blocking property.

In an embodiment of the present inventive concept, the first and second resins are maintained in a liquid state from a point at which the first and second resins are irradiated by the first UV ray to a point at which the pressing of the sensor module occurs.

DETAILED DESCRIPTION OF THE EMBODIMENT

Figure 1:
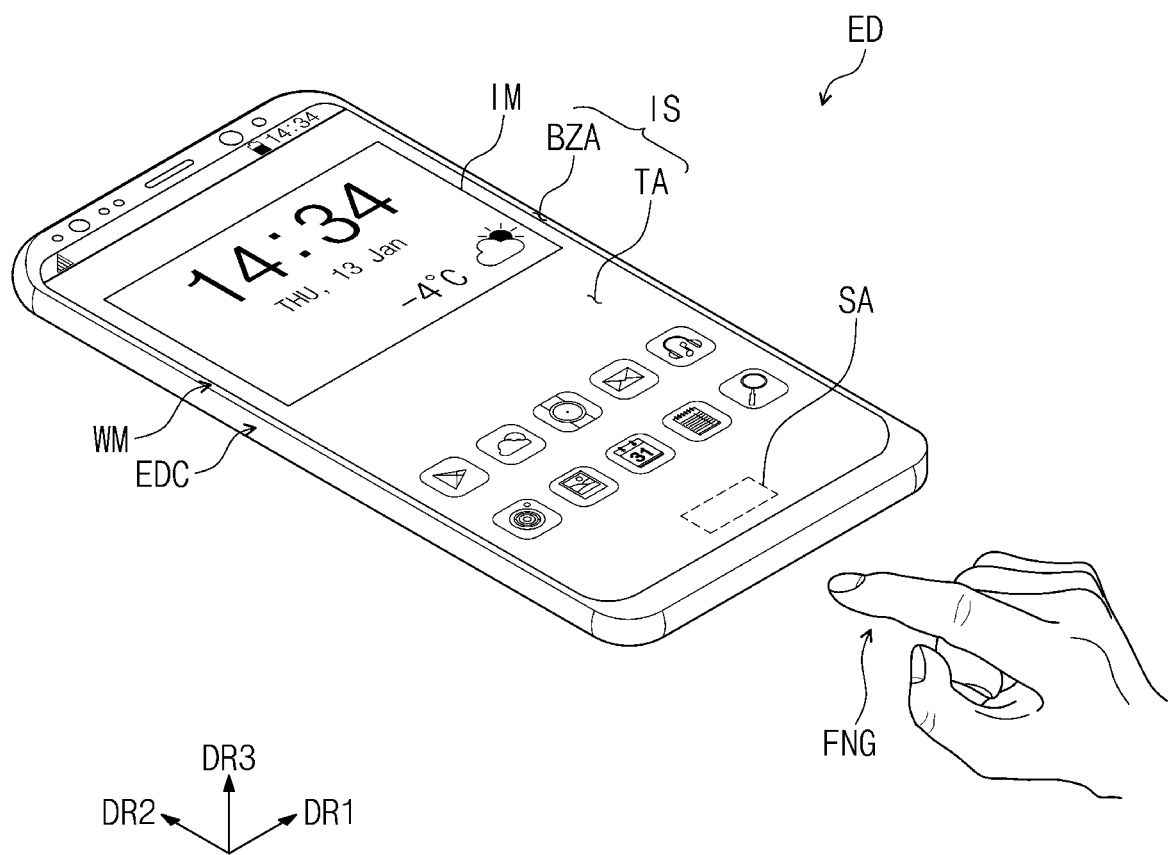
FIG. 1 is a perspective view illustrating an electronic device according to an embodiment of the present inventive concept.

Embodiments of the present inventive concept will now be described more fully with reference to the accompanying drawings. Embodiments of the present inventive concept may, however, be embodied in many different forms and should not be construed as being limited to the embodiments set forth herein. In the drawings, various thicknesses, lengths, and angles are shown and while the arrangement shown does indeed represent an embodiment of the present invention, it is to be understood that modifications of the various thicknesses, lengths, and angles may be possible within the spirit and scope of the present invention and the present invention is not necessarily limited to the particular thicknesses, lengths, and angles shown. It is to be understood that like reference numerals may refer to like elements throughout the specification, and thus redundant descriptions may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise.

FIG. 1 is a perspective view illustrating an electronic device according to an embodiment of the present inventive concept.

Referring to FIG. 1, an electronic device ED may be a device that is activated by an electrical signal applied thereto. The electronic device ED may be provided in various forms. For example, the electronic device ED may be one of tablets, laptop computers, computers, smart televisions, or so forth. As shown in FIG. 1, the electronic device ED in the present embodiment may be a smart phone.

A top surface of the electronic device ED may be a display surface IS and may be parallel to a plane defined by a first direction DR1 and a second direction DR2 crossing the first direction DR1. An image IM, which is generated by the electronic device ED, may be provided to a user through the display surface IS. Although the display surface IS is illustrated to have a flat shape, the present inventive concept is not limited thereto. For example, the electronic device ED may include a curved display surface or a three-dimensional display surface.

The display surface IS may include a transmission region TA and a bezel region BZA. The transmission region TA may be used to display the image IM. The image IM, which is displayed through the transmission region TA, may be provided to a user. In the present embodiment, the transmission region TA is illustrated to have a rectangular shape with rounded corners. However, the present inventive concept is not limited to this example, and in an embodiment of the present inventive concept, the shape of the transmission region TA may be variously changed.

The bezel region BZA might not be used to display the image IM. The bezel region BZA may be adjacent to the transmission region TA. For example, the bezel region BZA may be provided to enclose the transmission region TA. In other words, the bezel region BZA may form a border of the display surface IS. However, the present inventive concept is not limited thereto, and the shapes of the transmission and bezel regions TA and BZA may be designed in various different manners. For example, the bezel region BZA may be locally disposed near one side of the transmission region TA or may be omitted. As shown in FIG. 1, the image IM may be a clock widget and an application icon, but the present inventive concept is not limited thereto.

A direction normal to the display surface IS (e.g., a thickness direction of the electronic device ED) may be referred to as a third direction DR3. In the present specification, a front or top surface and a rear or bottom surface of each element or member may be defined, based on a direction in which the image IM is displayed. Hereinafter, a front or top surface and a rear or bottom surface of each element are differentiated based on the third direction DR3. However, directions indicated by the first to third directions DR1, DR2, and DR3 may be relative concepts, and in certain embodiments, they may be changed to indicate other directions.

The electronic device ED may include a sensing region SA, which is used to sense a user's biometric information provided from the outside. In the present embodiment, the sensing region SA is illustrated to be placed within the transmission region TA which displays the image IM. However, the present inventive concept is not limited thereto, and in an embodiment of the present inventive concept, the sensing region SA may be provided in the bezel region BZA, throughout the entire transmission region TA, or throughout the entire display surface IS.

The user's biometric information may be information on fingerprint, iris, or face of the user. In the present embodiment, a fingerprint FNG is illustrated to be sensed through the sensing region SA, but the sensing region SA may be configured to collect information on the iris or face of the user.

Figure 2:
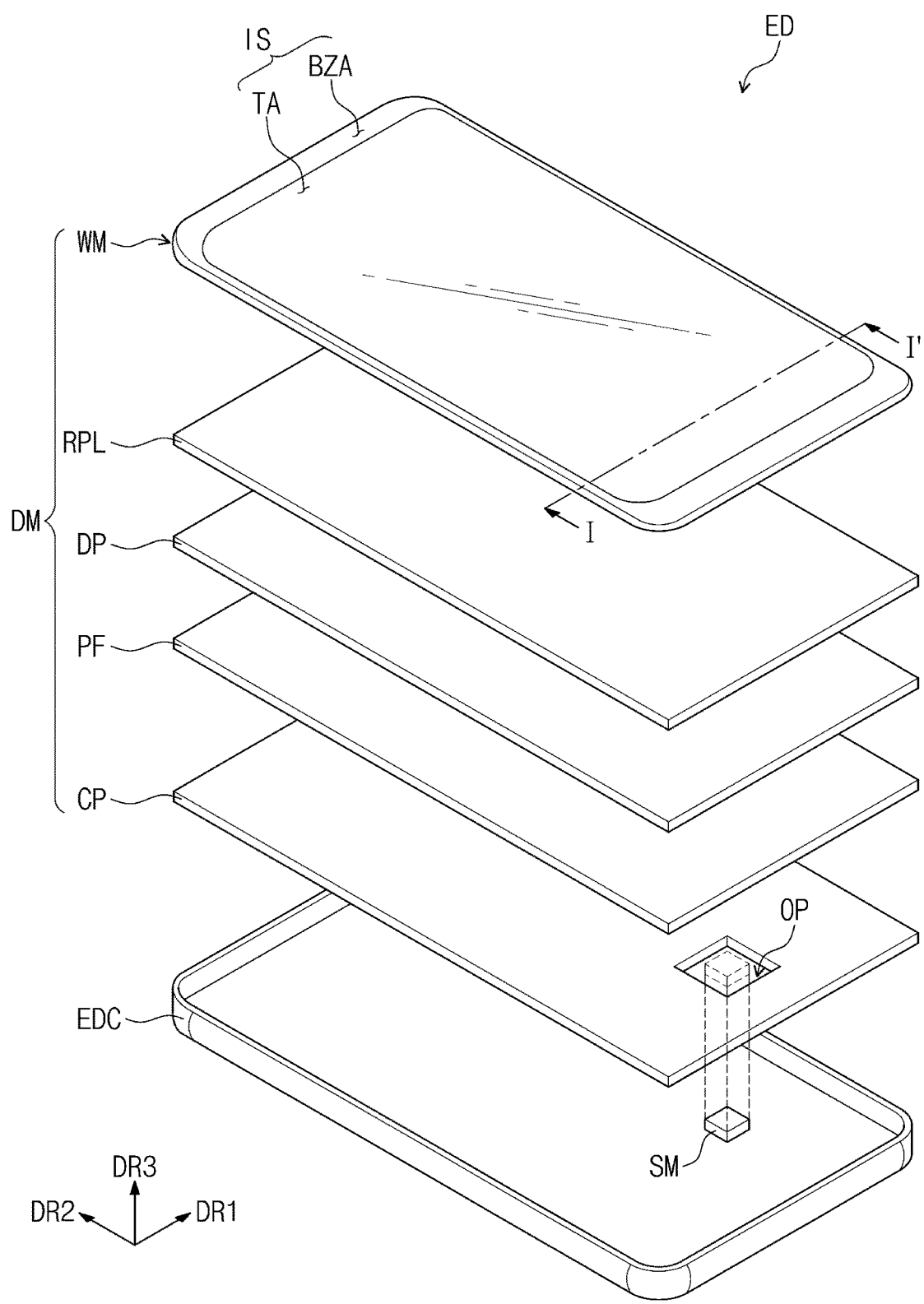
FIG. 2 is an exploded perspective view illustrating an electronic device according to an embodiment of the present inventive concept.
Figure 3:
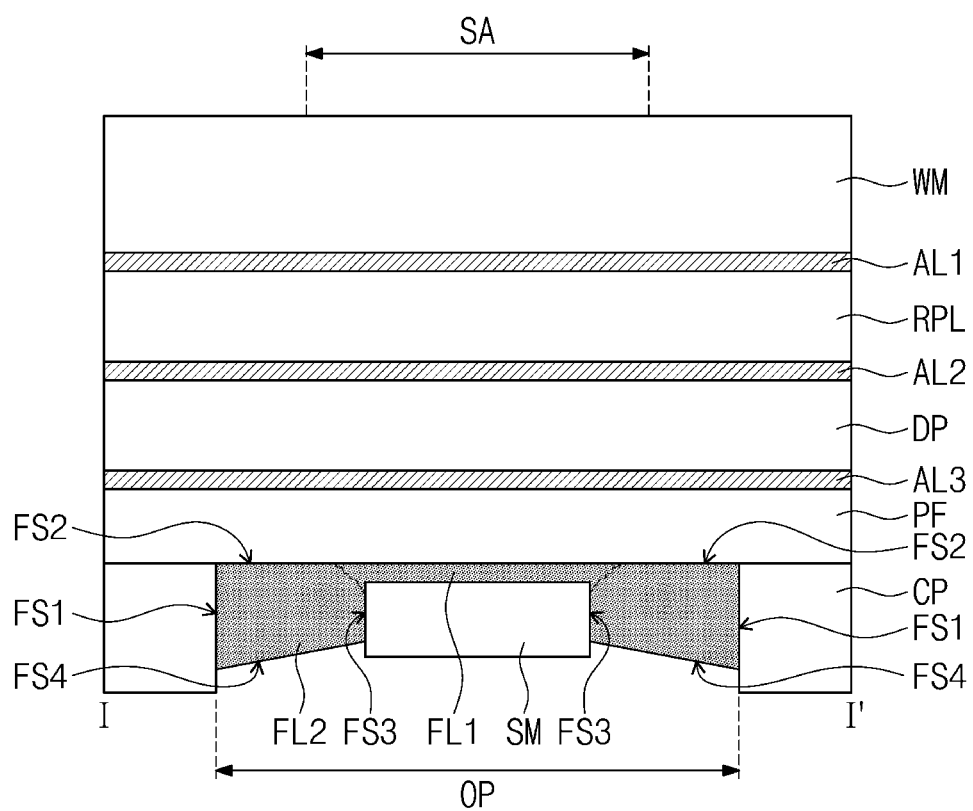
FIG. 3 is a sectional view taken along a line I-I' of FIG. 2.

FIG. 2 is an exploded perspective view illustrating an electronic device according to an embodiment of the present inventive concept. FIG. 3 is a sectional view, which is taken along a line I-I' of FIG. 2 to illustrate an electronic device according to an embodiment of the present inventive concept.

Referring to FIGS. 1, 2, and 3, the electronic device ED according to an embodiment of the present inventive concept may include a display module DM, a sensor module SM, and an outer case EDC. The display module DM may include a window WM, an anti-reflection layer RPL, a display panel DP, a protection film PF, and a cover panel CP. However, the present inventive concept is not limited thereto, and for example, at least one additional element may be provided in the electronic device ED.

The window WM may be included in the electronic device ED to form an outer appearance of the electronic device ED. The window WM may protect internal components of the electronic device ED from an external impact and may be an element that is substantially used as the display surface IS of the electronic device ED.

The anti-reflection layer RPL may be disposed below the rear surface of the window WM. The anti-reflection layer RPL may be configured to reduce optical reflectance of external light which is incident through the window WM. In an embodiment of the present inventive concept, the anti-reflection layer RPL may include a phase retarder and a polarizer. The phase retarder may be a film type or a liquid crystal coating type and may include a $\lambda/2$ or $\lambda/4$ phase retarder. The polarizer may be a film type or a liquid crystal coating type. The polarizer of the film type may include a stretched synthetic resin film, and the polarizer of the liquid crystal coating type may include liquid crystals arranged with a specific orientation. For example, the phase retarder and the polarizer may be realized using a single polarizer film. The anti-reflection layer RPL may further include a protection layer, which may be disposed on or below the polarizer.

The electronic device ED may further include a first adhesive layer AL1. The first adhesive layer AL1 may be disposed between the anti-reflection layer RPL and the window WM to attach the window WM to the anti-reflection layer RPL.

The display panel DP may be disposed between the anti-reflection layer RPL and the protection film PF. The display panel DP may be configured to generate the image IM (see, e.g., FIG. 1) and to provide the generated image IM to the window WM. In an embodiment of the present inventive concept, the display panel DP may be a light-emitting type display panel, but the present inventive concept is not limited to a specific type of display panel DP. For example, the display panel DP may be an organic light-emitting display panel, an inorganic light-emitting display panel, or a quantum-dot light-emitting display panel. A light emitting layer of the organic light-emitting display panel may be formed of or include at least one of organic luminescent materials, and a light emitting layer of the inorganic light-emitting display panel may be formed of or include at least one of inorganic luminescent materials. A light emitting layer of the quantum-dot light-emitting display panel may include quantum dots or quantum rods.

The electronic device ED may further include a second adhesive layer AL2. The second adhesive layer AL2 may be disposed between the display panel DP and the anti-reflection layer RPL to attach the anti-reflection layer RPL to the display panel DP.

The protection film PF may be disposed between the display panel DP and the cover panel CP. The protection film PF may be used to support and/or protect components of the display panel DP. The protection film PF may be formed of or include at least one of, for example, plastic, glass, or organic/inorganic composite materials. For example, the protection film PF may be formed of or include polyethylene terephthalate. The protection film PF might not have a light-blocking property. For example, the protection film PF may be formed of an optically transparent material.

The electronic device ED may further include a third adhesive layer AL3. The third adhesive layer AL3 may be disposed between the display panel DP and the protection film PF to attach the display panel DP to the protection film PF.

The cover panel CP may be disposed on the protection film PF. For example, the cover panel CP may be disposed below the protection film PF. The cover panel CP may protect the display panel DP from an external environment. For example, the cover panel CP may be configured to absorb a physical impact from the outside and/or to prevent a contamination material or moisture from entering the display panel DP. The cover panel CP may be coated on the rear surface of the protection film PF or may be provided in the form of a film to be attached to the protection film PF.

As shown in FIG. 2, the cover panel CP may include an open portion OP. The open portion OP may be provided at a position corresponding to the sensing region SA (see, e.g., FIG. 1). For example, an area of the open portion OP may be larger than or equal to an area of the sensing region SA. The open portion OP may be formed to penetrate the cover panel CP. Thus, the open portion OP may partially expose the rear surface of the protection film PF.

The sensor module SM may be configured to sense the user's biometric information. The sensor module SM may include at least one of, for example, a fingerprint recognition sensor, an iris recognition sensor, or a face recognition sensor. In an embodiment of the present invention, the sensor module SM may include the fingerprint recognition sensor.

As described above, the sensor module SM may be configured to sense a user's fingerprint FNG (see, e.g., FIG. 1) that is positioned at the sensing region SA. The sensor module SM may overlap the sensing region SA.

For example, the sensor module SM may be a fingerprint recognition sensor that is operated in an ultrasonic wave manner. For example, the fingerprint recognition sensor may be configured to send an ultrasonic wave toward the user's fingerprint FNG, to sense a difference in sonic reflectance between ridge and valley patterns of the user's fingerprint FNG, and to measure the distance to the user's fingerprint FNG based on data of the ridge and valley patterns.

Referring to FIG. 2, the sensor module SM may be placed or contained in the open portion OP of the cover panel CP. The sensor module SM may be spaced apart from the protection film PF by a specific distance in the third direction DR3. In addition, the sensor module SM may be spaced apart from at least one side surface of the cover panel CP, which defines the open portion OP, by a specific distance. For example, the sensor module SM may be spaced apart from an inner side surface of the open portion OP of the cover panel CP. A first filling layer FL1 may be disposed between the protection film PF and the sensor module SM, and a second filling layer FL2 may be disposed between the sensor module SM and the side surface of the cover panel CP.

The outer case EDC may be combined with the window WM. The rear surface of the electronic device ED may be defined by the outer case EDC, and the window WM and the outer case EDC, which are combined with each other, may define an internal space. The outer case EDC may be formed of or include a material having a relatively high hardness and rigidity. For example, the outer case EDC may include a plurality of frames and/or plates, each of which is formed of at least one of glass, plastic, or metallic materials. For example, the outer case EDC may stably protect components of the display panel DP, which are placed in the internal space, from an external impact.

Referring to FIG. 3, the first filling layer FL1 may be disposed in the open portion OP of the cover panel CP and between the protection film PF and the sensor module SM. The first filling layer FL1 may be provided to have a size corresponding to the sensor module SM. For example, the first filling layer FL1 may cover one surface (e.g., an upper surface) of the sensor module SM. However, the present inventive concept is not limited to this example, and in an embodiment of the present invention, the first filling layer FL1 may have a size larger than the sensor module SM.

The second filling layer FL2 may be disposed in the open portion OP of the cover panel CP and may be disposed on the side surface of the cover panel CP that defines the open portion OP, the side surface of the sensor module SM, and the rear surface of the protection film PF. For example, the second filling layer FL2 may be in contact with an inner side surface of the open portion OP of the cover panel CP, the side surface of the sensor module SM, and the rear surface of the protection film PF.

The second filling layer FL2 may include a first surface FS1, which is in contact with the side surface of the cover panel CP, a second surface FS2, which is in contact with the rear surface of the protection film PF, a third surface FS3, which is in contact with the side surface of the sensor module SM, and a fourth surface FS4, which is opposite to the second surface FS2. A height of the first surface FS1 may be different from a height of the second surface FS2. For example, the first surface FS1 may have a height larger than that of the second surface FS2. Due to the height difference between the first and second surfaces FS1 and FS2, the fourth surface FS4 may have an inclined surface profile. However, the fourth surface FS4 is not limited to the inclined shape. For example, the fourth surface FS4 may have a structure that is concavely curved toward the protection film PF.

The first and second filling layers FL1 and FL2 may cause a stress during a fabrication process. The stress may result in deformation of the display panel DP. In the case where the second filling layer FL2 is in contact with side surfaces of the cover panel CP and side surfaces of the sensor module SM, a stress of the second filling layer FL2 may be reduced when compared to the structure in which the second filling layer FL2 is in contact with one of the side surfaces of the cover panel CP and the sensor module SM. As a result, it may be possible to prevent or suppress the display panel DP from being deformed by the stress of the second filling layer FL2.

In an embodiment of the present invention, each of the first and second filling layers FL1 and FL2 may be formed of or include a UV curable material, which can be cured under the condition in which an ultraviolet ray is used. For example, the UV curable material may include epoxy resin or silicone.

The first and second filling layers FL1 and FL2 may be formed of or include the same UV curable material as each other, but the present inventive concept is not limited thereto; for example, the first and second filling layers FL1 and FL2 may be formed of or include UV curable materials different from each other. In an embodiment of the present invention, even when the first and second filling layers FL1 and FL2 include different UV curable materials, the UV curable materials, which are respectively included in the first and second filling layers FL1 and FL2, may exhibit the same curing property as each other under the same curing condition.

The first and second filling layers FL1 and FL2 may be provided to fully fill the open portion OP of the cover panel CP. If a portion of the open portion OP is not filled with the first and second filling layers FL1 and FL2, an air gap may be formed in the unfilled portion. In the case where a highly-intense external light (e.g., solar light) of about 10,000 Lux or higher is incident into the display panel DP, the external light may pass through the display panel DP and may be output to a region below the display panel DP. The output external light may be reflected by the air gap and may propagate toward a region on the display panel DP, and in this case, a user may recognize a fraction of the external light reflected by the air gap. Furthermore, in the case where the reflected light is recognized by the user when an image is displayed on the display panel DP, the reflected light may affect image characteristics (e.g., resolution, color, or texture) and may deteriorate the display quality of the electronic device ED. According to an embodiment of the present inventive concept, since the first and second filling layers FL1 and FL2 are formed to fully fill the open portion OP, the air gap might not be formed, and thus, it may be possible to prevent the display quality of the electronic device ED from being deteriorated by the reflected light.

The first and second filling layers FL1 and FL2 may be formed of or include a material (e.g., black dye or pigment) having a light-blocking property. Thus, an external light, which is incident into the open portion OP, may be absorbed by the first and second filling layers FL1 and FL2, and as a result, it may be possible to prevent an undesired reflection phenomenon of the external light.

In an embodiment of the present inventive concept, to sense the user's fingerprint FNG through the sensor module SM, an ultrasonic wave may be provided or sent to the sensor module SM through the sensing region SA. For example, an ultrasonic wave having a frequency of about 1 MHz to 100 MHz may be sent to the sensor module SM. Referring to FIG. 3, the sensor module SM may be in direct contact with the first and second filling layers FL1 and FL2. The first and second filling layers FL1 and FL2 may be provided to have a modulus (e.g., a bulk modulus, an elastic modulus, and a shear modulus) of about 1 GPa or higher at the room temperature (e.g., about 15° C. to about 30° C.), and in this case, it may be possible to effectively send an ultrasonic wave having a frequency of about 1 MHz to about 100 MHz to the sensor module SM.

Hereinafter, a process of fabricating the electronic device ED will be described in more detail with reference to FIGS. 4A to 10.

Figure 4A:
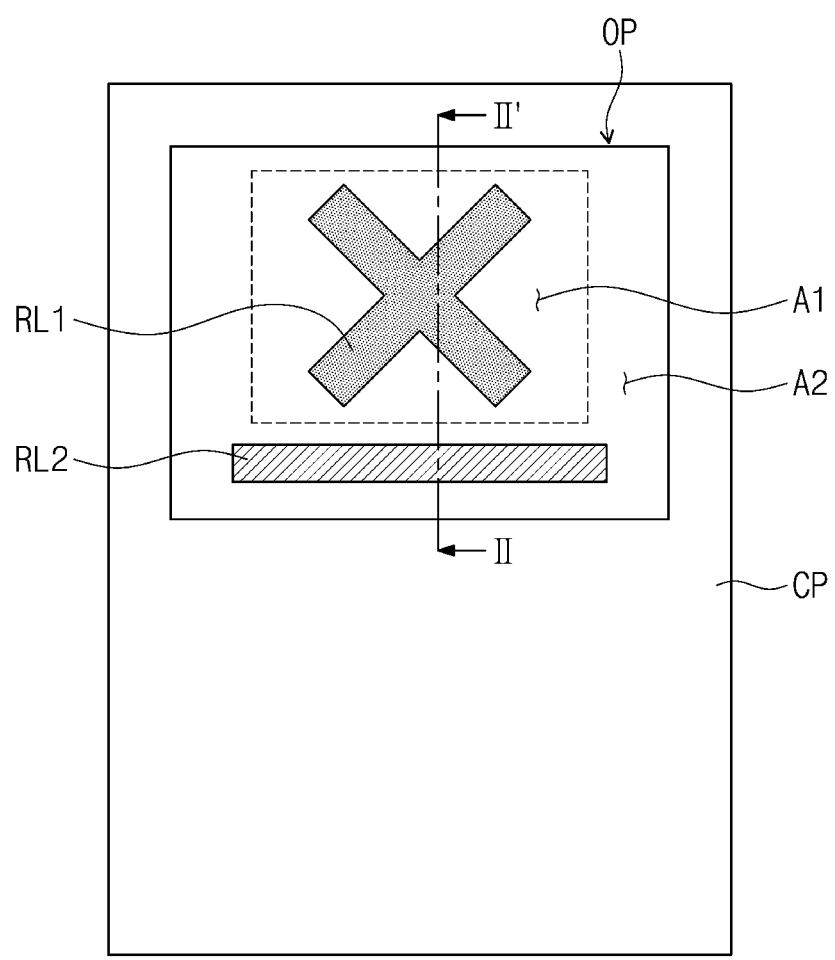
FIG. 4A is a diagram illustrating a step of forming first and second resins on first and second regions, respectively, of a protection film, according to an embodiment of the present inventive concept.
Figure 4B:
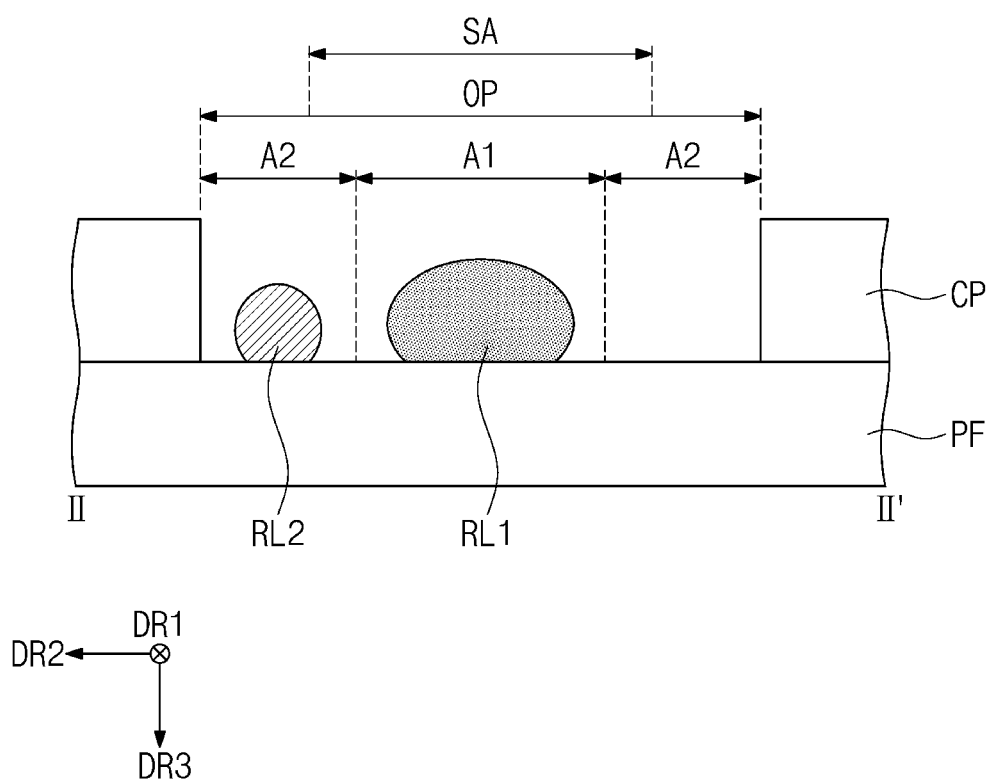
FIG. 4B is a sectional view taken along a line II-II' of FIG. 4A.

FIG. 4A is a diagram illustrating a step of forming first and second resins on first and second regions, respectively, of a protection film, according to an embodiment of the present inventive concept. FIG. 4B is a sectional view taken along a line II-II' of FIG. 4A. FIG. 4A is a rear view of the cover panel CP with the open portion OP partially exposing the rear surface of the protection film PF.

Referring to FIGS. 4A and 4B, the open portion OP of the cover panel CP may include a first region A1 and a second region A2. The sensing region SA (see, e.g., FIG. 1) may have a width that is smaller than that of the open portion OP and larger than that of the first region A1. However, the present inventive concept is not limited thereto. For example, the sensing region SA may have a width corresponding to the open portion OP of the cover panel CP.

A first resin RL1 and a second resin RL2 may be formed on the rear surface of the protection film PF, which is exposed through the open portion OP. The first resin RL1 may be formed on the first region A1 of the open portion OP, and the second resin RL2 may be formed on the second region A2 which is adjacent region of the first region A1. The first region A1 may be formed to have a polygonal shape and a size corresponding to the sensor module SM. For example, the first region A1 may have a tetragonal or rectangular shape. The second region A2 may be formed to enclose the first region A1.

In an embodiment of the present inventive concept, the first resin RL1 on the first region A1 may be formed to have a shape of a letter 'X'. However, the present inventive concept is not limited thereto, and the first resin RL1 may be formed in various different shapes. The present inventive concept is not limited to specific values of heights or thicknesses of the first and second resins RL1 and RL2, but if the first and second resins RL1 and RL2 are formed to an excessively large thickness, the first or second resin RL1 or RL2 may overflow the open portion OP (e.g., to the lower surface of the cover panel CP) in a subsequent step of attaching the sensor module SM. Thus, amounts of the first and second resins RL1 and RL2 may be adjusted in consideration of the size and depth of the open portion OP.

As shown in FIG. 4A, the first resin RL1 may be formed in the first region A1 to be spaced apart from a boundary between the first and second regions A1 and A2. In addition, the first resin RL1 may be formed in the first region A1 to be in contact with the boundary. The second resin RL2 may be formed in the second region A2 to be spaced apart from the boundary. However, in an embodiment of the present inventive concept, the second resin RL2 may be formed to be in contact with the boundary. As shown in FIG. 4A, the first and second resins RL1 and RL2 may be spaced apart from each other with the boundary interposed therebetween, but the present inventive concept is not limited thereto; for example, the first and second resins RL1 and RL2 may be connected to each other at the boundary.

Each of the first and second resins RL1 and RL2 may be formed of or include a UV curable material. The first and second resins RL1 and RL2 may be formed of or include the same UV curable material as each other, but the present inventive concept is not limited thereto; for example, the first and second resins RL1 and RL2 may be formed of or include UV curable materials different from each other. However, even when the first and second resins RL1 and RL2 include different UV curable materials, the first and second resins RL1 and RL2 may exhibit the same curing property as each other under the same curing condition.

The first and second resins RL1 and RL2 may have a light-blocking property and may be formed in the form of liquid.

The second resin RL2 may be formed in the second region A2 to have a cylindrical shape extending in the first direction DR1. However, the present inventive concept is not limited thereto; for example, the second resin RL2 may be formed to have a shape different from that of the cylindrical shape.

Each of the first and second resins RL1 and RL2 may be formed of or include a UV delay curable material. For example, the UV delay curable material may include epoxy resin or silicone. For example, each of the first and second resins RL1 and RL2 may be formed of or include an UV delay curable resin that is slowly cured when it is irradiated with a UV ray of a low intensity.

Figure 5A:
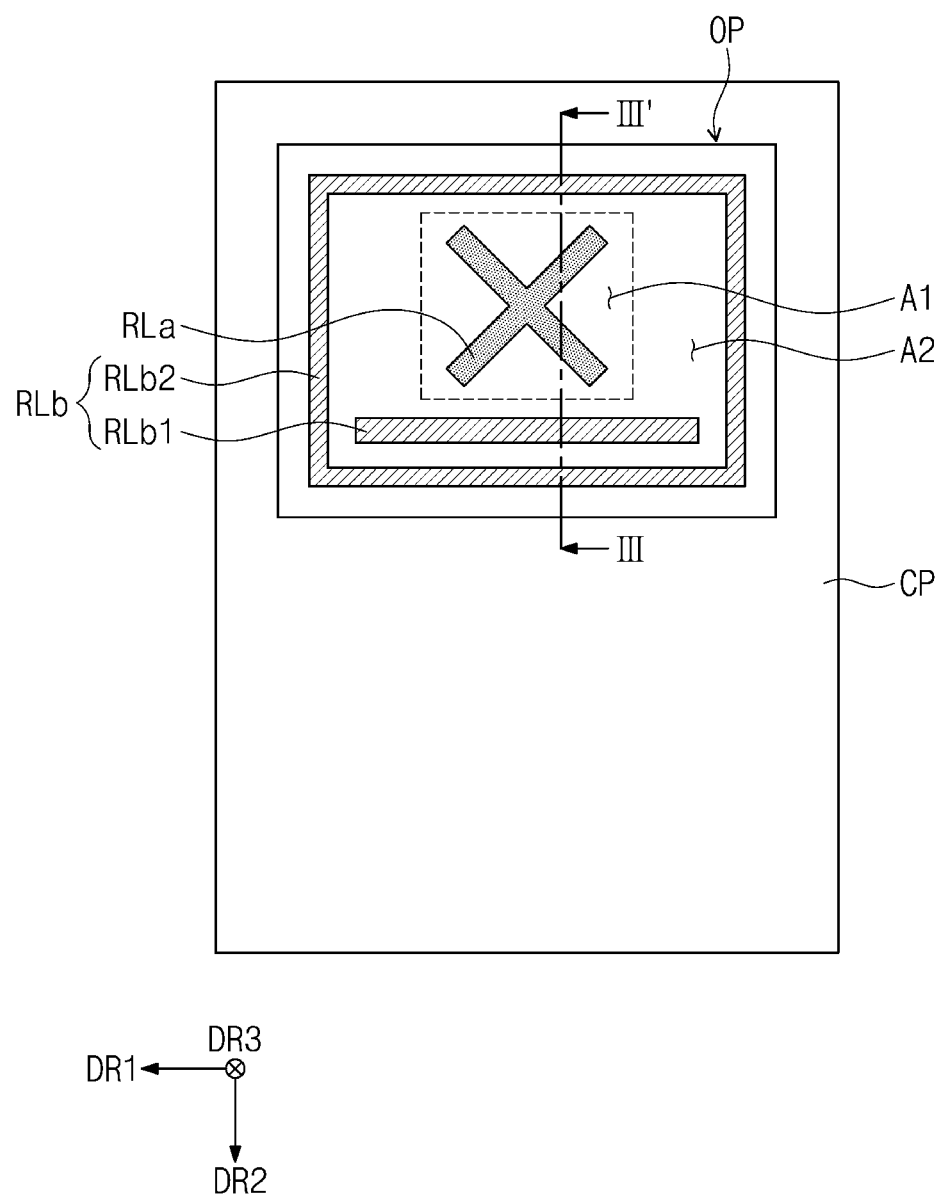
FIG. 5A is a diagram illustrating a step of forming first and second resins on first and second regions, respectively, of a protection film, according to an embodiment of the present inventive concept.
Figure 5B:
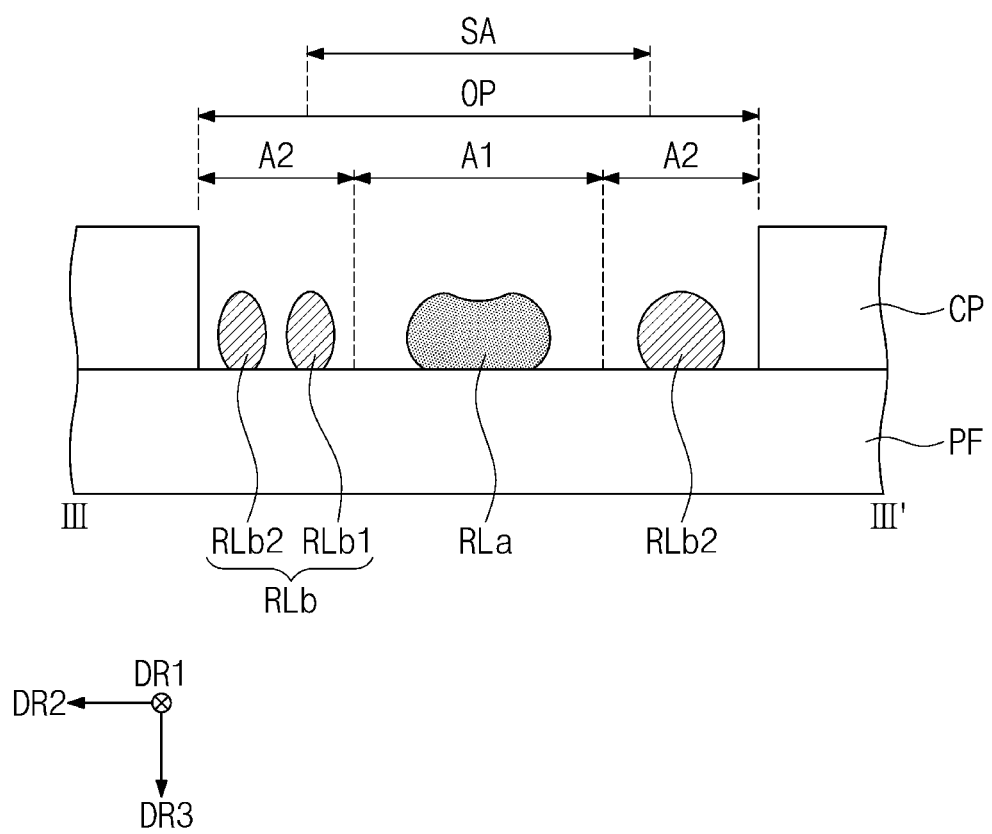
FIG. 5B is a sectional view taken along a line III-III' of FIG. 5A.

FIG. 5A is a diagram illustrating a step of forming first and second resins RLa and RLb on the first and second regions A1 and A2, respectively, of the protection film PF, according to an embodiment of the present inventive concept. FIG. 5B is a sectional view taken along a line III-III' of FIG. 5A. In the following description of FIGS. 5A and 5B, an element previously described with reference to FIGS. 4A and 4B will be identified by the same reference number without repeating an overlapping description thereof.

Referring to FIGS. 5A and 5B, the first region A1 of the open portion OP may be coated with the first resin RLa, and the second region A2 of the open portion OP may be coated with the second resin RLb.

The first resin RLa may be formed to have the shape of a letter "X", like the first resin RL1 of FIG. 4A, but may be formed to have a width smaller than that of the first resin RL1. In addition, the first resin RLa may be formed such that a total size thereof is smaller than that of the first resin RL1.

The second resin RLb may include a first sub-resin RLb1 and a second sub-resin RLb2. The first sub-resin RLb1 may have a cylindrical shape extending in the first direction DR1, and the second sub-resin RLb2 may have a closed-loop shape (e.g., a rectangular annular shape). In an embodiment of the present inventive concept, the second sub-resin RLb2 may have a tetragonal closed-loop shape, but the present inventive concept is not limited thereto; for example, the shape of the second sub-resin RLb2 may be variously changed depending on the shape of the open portion OP. The first sub-resin RLb1 may be disposed between the second sub-resin RLb2 and the first resin RLa. The first sub-resin RLb1 may be spaced apart from the second sub-resin RLb2 by a specific distance and the first resin RLa by a specific distance.

Figure 6:
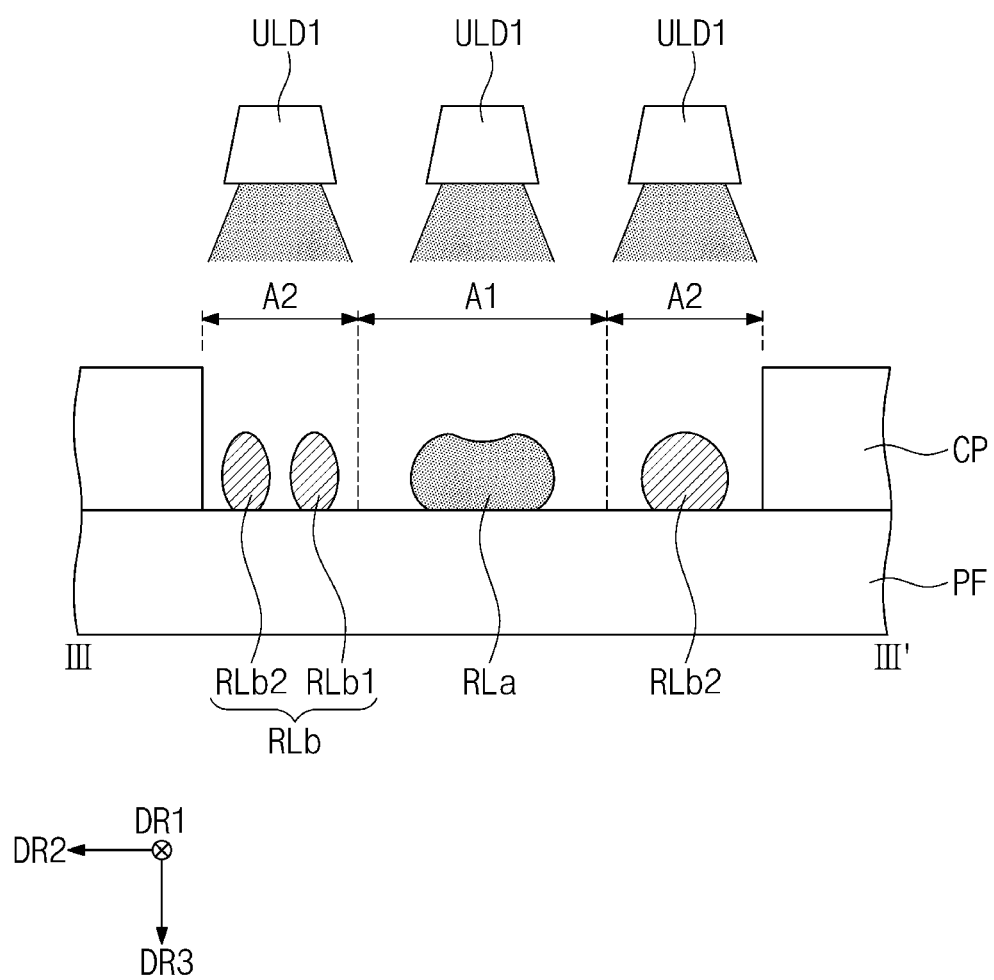
FIG. 6 is a diagram illustrating a step of emitting a first UV ray to a first resin and a second resin, according to an embodiment of the present inventive concept.

FIG. 6 is a diagram illustrating a step of emitting a first UV ray to the first and second resins RL1 and RL2, according to an embodiment of the present inventive concept.

Referring to FIG. 6, the first and second resins RLa and RLb may be irradiated with the first UV ray. The first and second resins RLa and RLb are illustrated to be irradiated with the first UV ray, which is emitted from a first UV irradiation module ULD1 disposed over the first and second resins RLa and RLb, but the present inventive concept is not limited to the specific number of the first UV irradiation modules ULD1. For example, the number of the first UV irradiation modules ULD1 may be one but may be greater than one.

The first UV irradiation module ULD1 may emit the first UV ray of a relatively low intensity, and in this case, the first and second resins RLa and RLb may be slowly cured. For example, the first UV irradiation module ULD1 may be configured to emit the first UV ray whose intensity ranges from about 200 mJ/cm$^3$ to 2000 mJ/cm$^3$, toward the first and second resins RLa and RLb. The first and second resins RLa and RLb may be irradiated with the first UV ray, which is emitted from the first UV irradiation module ULD1, for about 0.25 seconds to about 20 seconds. In addition, since the first and second resins RLa and RLb include the UV delay curable resin, a curing reaction in the first and second resins RLa and RLb might not occur immediately after the emission of the first UV ray by the first UV irradiation module ULD1. Thus, the first and second resins RLa and RLb may be maintained in a liquid state for a while after the first UV irradiation process.

Figure 7:
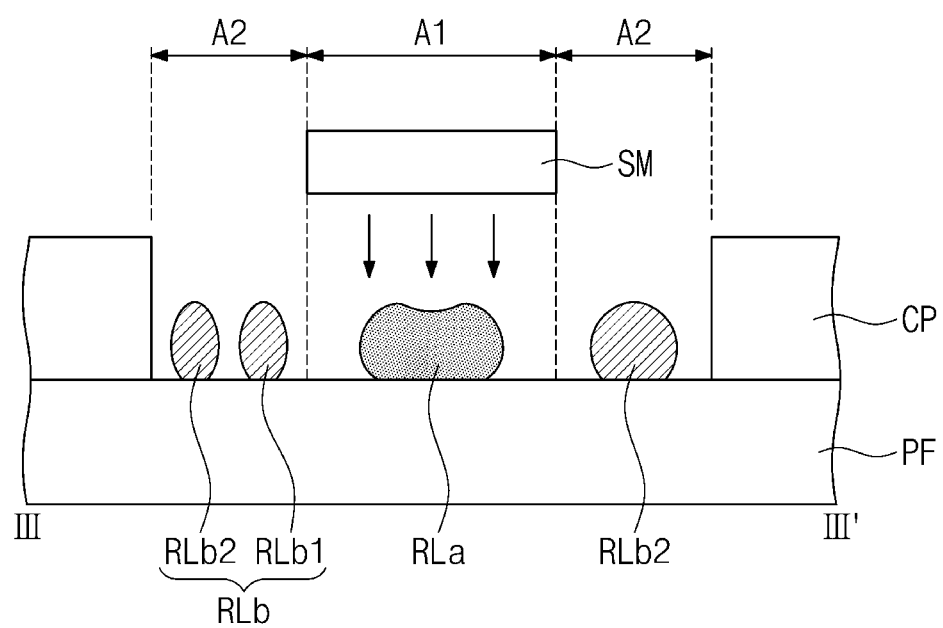
FIG. 7 is a diagram illustrating a process of attaching a sensor module to a first region.
Figure 8A:
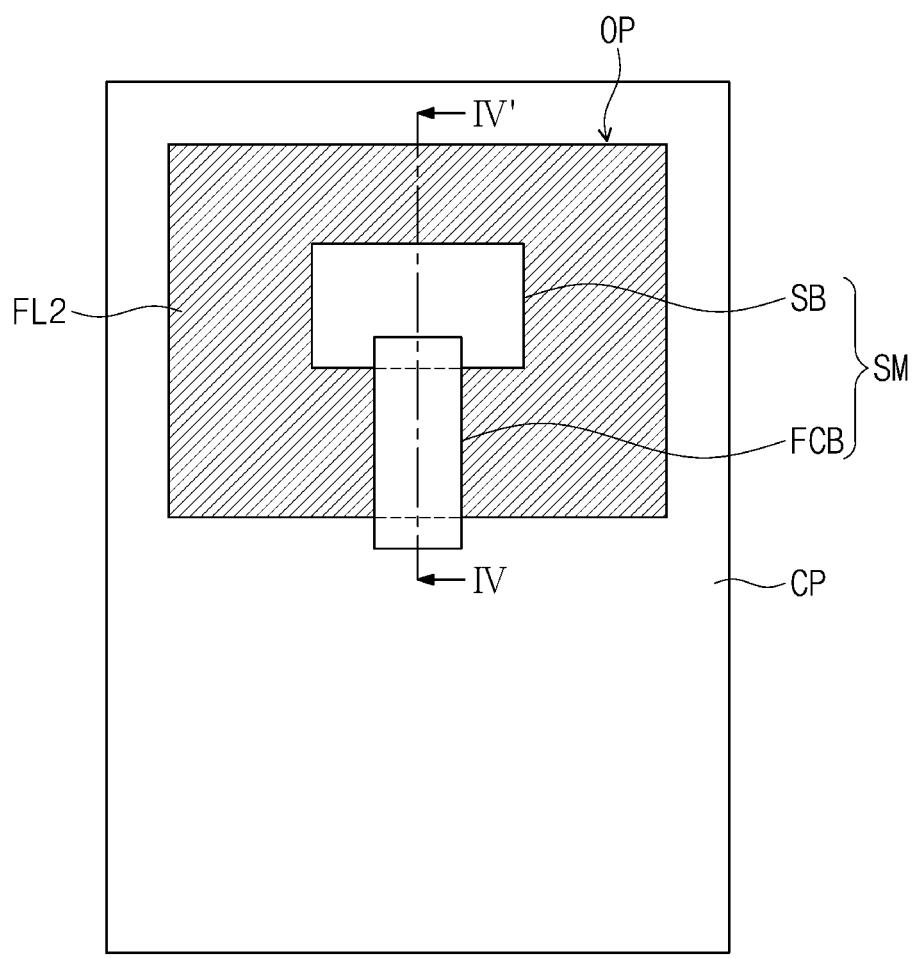
FIG. 8A is a diagram illustrating a display module, to which a sensor module is attached, according to an embodiment of the present inventive concept.
Figure 8B:
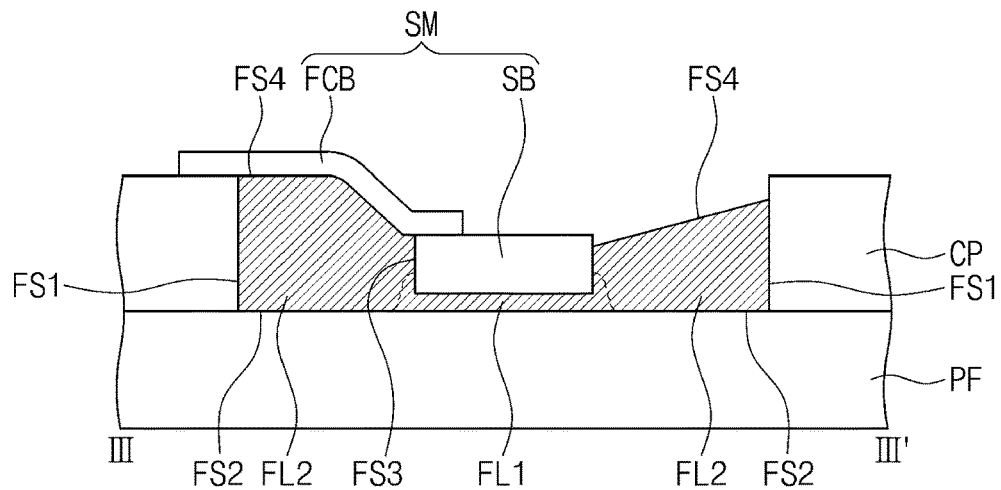
FIG. 8B is a sectional view taken along a line IV-IV' of FIG. 8A.
Figure 8B:
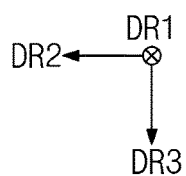

FIG. 7 is a diagram illustrating a process of attaching the sensor module SM to the first resin RLa that is formed on the protection film PF. FIG. 8A is a plan view illustrating the first filling layer FL1, to which the sensor module SM is attached. FIG. 8B is a sectional view taken along a line IV-IV' of FIG. 8A.

Referring to FIGS. 7 and 8A, the sensor module SM may be disposed on the first region A1 provided with the first resin RLa.

The sensor module SM may include a sensor substrate SB including a fingerprint recognition sensor and a circuit substrate FCB connected to the sensor substrate SB. The sensor substrate SB may be overlapped with the first region A1, and the circuit substrate FCB may be overlapped with the second region A2. In an embodiment of the present inventive concept, the sensor substrate SB may have a size corresponding to that of the first region A1. However, the size of the sensor substrate SB is not limited thereto. For example, the sensor substrate SB may have an area that is larger than an area of the first region A1. In addition, the sensor substrate SB may have a rectangular shape corresponding to the shape of the open portion OP, but in an embodiment of the present inventive concept, it may have various shapes (e.g., a circular shape). A portion of the circuit substrate FCB may be located on the rear surface of the cover panel CP.

The sensor module SM may be moved toward the first resin RLa (e.g., in the third direction DR3) to be in contact with the first resin RLa. During this process, a pressure in the third direction DR3 may be exerted on the sensor module SM.

The first resin RL1 may be formed of or include a UV curable material (e.g., epoxy resin or silicone), as described with reference to FIG. 4A. For example, the first resin RLa may be formed of or include a UV delay curable material that is slowly cured when it is irradiated with a UV ray of a relatively low intensity. Thus, the first resin RL1 including epoxy resin or silicone may have a fluidic (i.e., less-cured) property for a while after the being irradiated by the first UV ray.

The first resin RLa, which is in a liquid state, may be spread by the pressure exerted on the sensor module SM to fill the space between the sensor module SM and the protection film PF. Thus, as shown in FIGS. 8A and 8B, the first filling layer FL1 may be formed in the first region A1.

A portion of the first resin RLa may be spread from the region between the sensor module SM and the protection film PF to the second region A2. For example, if an amount of the first resin RLa supplied during this process is greater than an amount for fully covering the first region A1, the first resin RLa may be flown to the second region A2. During the first resin RLa being flown toward the second region A2, the first resin RLa may be in contact with the second resin RLb, and as a result, the second resin RLb may be spread out by the pressure exerted by the first resin RLa to fill the second region A2. For example, the spreading of the first resin RLa may cause the second resin RLb to be spread out. During this process, the first and second resins RLa and RLb may be connected to each other to form a single resin layer.

Since the pressure is exerted on the second resin RLb by the first resin RLa, the second resin RLb may be formed to at least fully cover the second region A2. For example, due to the pressure exerted on the second resin RLb by the first resin RLa, the second resin RLb may form the second filling layer FL2, which is in contact with the side surface of the cover panel CP and the side surface of the sensor module SM and at least fully covers the second region A2. The second filling layer FL2 may include the first surface FS1, which is in contact with the side surface of the cover panel CP, the second surface FS2, which is in contact with the rear surface of the protection film PF, the third surface FS3, which is in contact with the side surface of the sensor module SM, and the fourth surface FS4, which is opposite to the second surface FS2.

In FIG. 8A, for clarity, the first and second filling layers FL1 and FL2 are illustrated to have an observable interface therebetween, but there may be no observable interface between the first and second filling layers FL1 and FL2.

The first and second filling layers FL1 and FL2, which are respectively formed from the first and second resins RLa and RLb, may have a light-blocking property. In an embodiment of the present inventive concept, the protection film PF, which is disposed on the first and second filling layers FL1 and FL2, might not have the light-blocking property. For example, the protection film PF may be in direct contact with the first and second filling layers FL1 and FL2. In the case where a highly-intense external light (e.g., solar light) of about 10,000 Lux or higher is incident onto the display panel DP (e.g., see FIG. 3), the external light may pass through the display panel DP and may be output to a region below the display panel DP. The output external light may be reflected by the air gap, which may be formed in an unfilled portion of the open portion OP, and may propagate toward a region on the display panel DP, and in this case, a user may recognize a fraction of the external light reflected by the air gap. Furthermore, in the case where the reflected light is recognized by the user when an image is displayed on the display panel DP, the reflected light may affect image characteristics (e.g., resolution, color, or texture) and may deteriorate the display quality of the electronic device ED. However, according to an embodiment of the present inventive concept, since the first and second filling layers FL1 and FL2 having the light-blocking property are disposed on the rear surface of the protection film PF, it may be possible to prevent the display quality of the electronic device ED from deteriorating by the reflected light.

The front surface of the cover panel CP may be attached to the rear surface of the protection film PF. In this case, the sensor module SM may be placed at a position that is closer to the protection film PF in the third direction DR3 than to the rear surface of the cover panel CP. Accordingly, a height of the first surface FS1 of the second filling layer FL2 may be greater than a height of the third surface FS3. However, the present inventive concept is not limited to specific heights and thicknesses of the first and second filling layers FL1 and FL2. Nevertheless, in a step of attaching the sensor module SM, an amount of the second resin RL2 (e.g., see FIG. 4A) may be adjusted such that thicknesses of the second filling layer FL2 is not thicker than thicknesses of the cover panel CP.

Referring to FIG. 8B, the fourth surface FS4 of the second filling layer FL2 may include two portions, one of which is overlapped with the circuit substrate FCB, and the other of which is not overlapped with the circuit substrate FCB. For example, the portion of the fourth surface FS4 overlapped with the circuit substrate FCB may be in contact with the circuit substrate FCB. The circuit substrate FCB may be in contact with the fourth surface FS4 of the second filling layer FL2, and in this case, it may be possible to prevent an air gap from being formed between the circuit substrate FCB and the second filling layer FL2. The two portions of the fourth surface FS4 may have different shapes from each other. The portion of the fourth surface FS4, which is in contact with the circuit substrate FCB, may have an inclined surface profile.

Figure 8C:
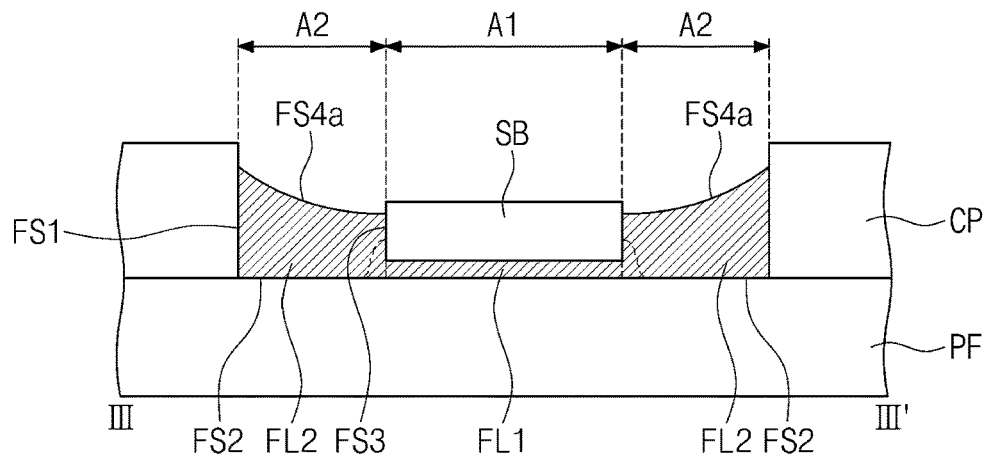
FIG. 8C is a sectional view illustrating first and second filling layers, to which a sensor module is attached, according to an embodiment of the present inventive concept.
Figure 8C:
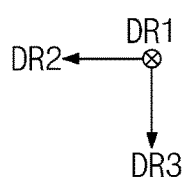

In addition, as shown in FIG. 8C, a fourth surface FS4a of the second filling layer FL2 may have a structure that is concavely curved toward the second surface FS2. In the case where the fourth surface FS4a is formed to have the concavely curved structure, it may be possible to reduce a stress issue and thereby to prevent or suppress the display panel DP (see, e.g., FIG. 3) from being deformed.

Figure 9:
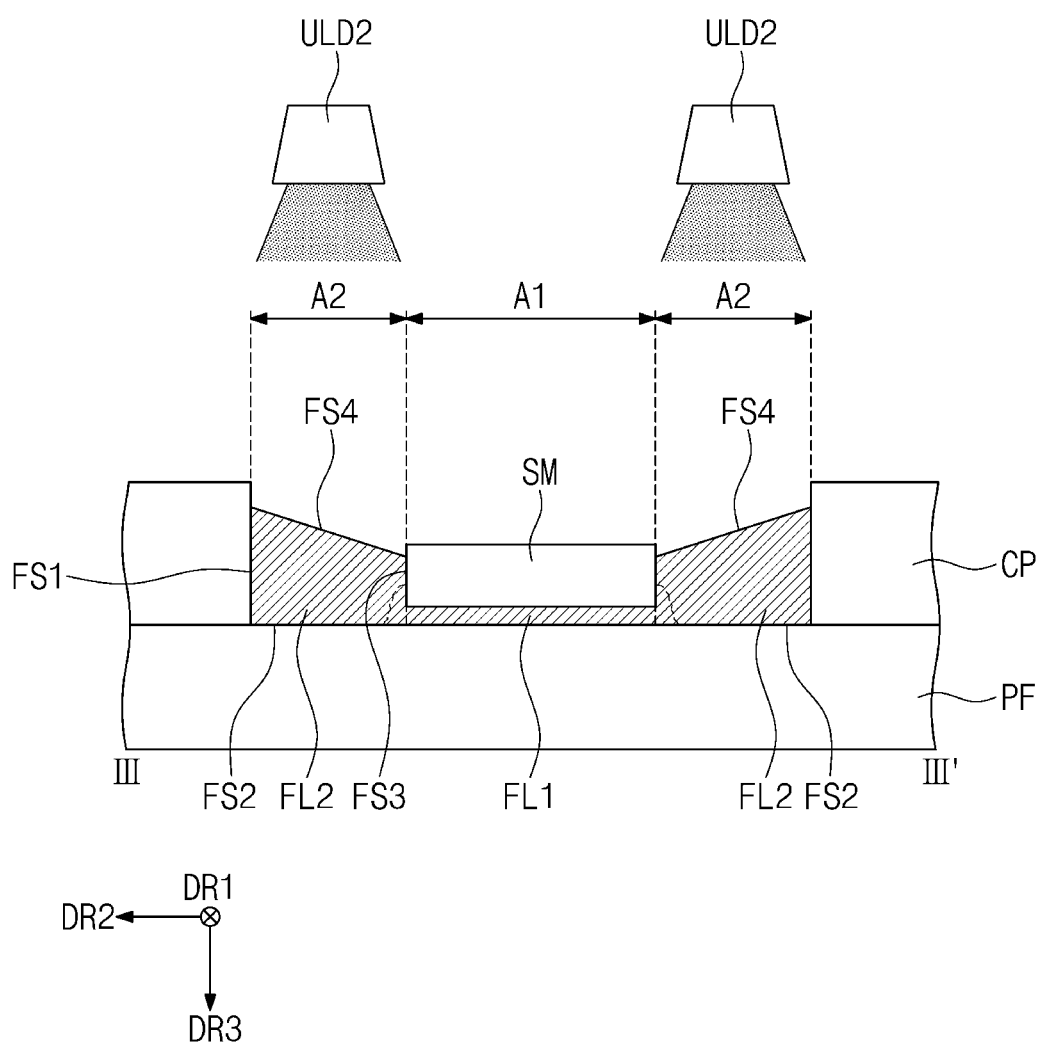
FIG. 9 is a diagram illustrating a step of emitting a second UV ray to a second filling layer, according to an embodiment of the present inventive concept.

FIG. 9 is a diagram illustrating a step of irradiating a second UV ray to the second filling layer FL2.

Referring to FIG. 9, the second filling layer FL2 in the second region A2 may be irradiated with a second UV ray. The second UV ray may be emitted from a second UV irradiation module ULD2. FIG. 9 illustrates an example, in which two second UV irradiation modules ULD2 are provided to emit the second UV ray toward the second filling layer FL2, but the number of the second UV irradiation modules ULD2 may be one or may be greater than one. In addition, the entirety of the second filling layer FL2 may be irradiated with the second UV ray. An intensity of the second UV ray incident into the second filling layer FL2 may be higher than an intensity of the first UV ray. For example, the second UV ray may have an intensity of about 4000 mJ/cm$^3$ or higher.

Referring to FIG. 9, the second UV irradiation module ULD2 may overlap on the fourth surface FS4 of the second filling layer FL2 to emit the second UV ray toward the fourth surface FS4. The second filling layer FL2 may be formed of or include an UV curable material, which can be quickly cured when irradiated with the second UV ray having the intensity of about 4000 mJ/cm$^3$. Since the second filling layer FL2 is being slowly cured since the irradiation of the first UV ray, the curing of the second filling layer FL2 may be accelerated by being irradiated by the second UV ray. Thus, the rapid curing of the second filling layer FL2 may be made from the fourth surface FS4, which is directly irradiated with the second UV ray, toward the first, second and third surfaces FS1, FS2, and FS3. A top portion of the second filling layer FL2 that includes the fourth surface FS4 may be used to stably fasten the sensor module SM by being cured by the second UV ray.

The first filling layer FL1 might not be directly irradiated with the second UV ray emitted from second UV irradiation module ULD2. Even when the first filling layer FL1 is not directly irradiated with the second UV ray, the curing of the first filling layer FL1 may be slowly lasted from the irradiation of the first UV ray. If the curing of the first filling layer FL1 is finished, the sensor module SM may be fixed to the rear surface of the protection film PF by the first filling layer FL1.

Figure 10:
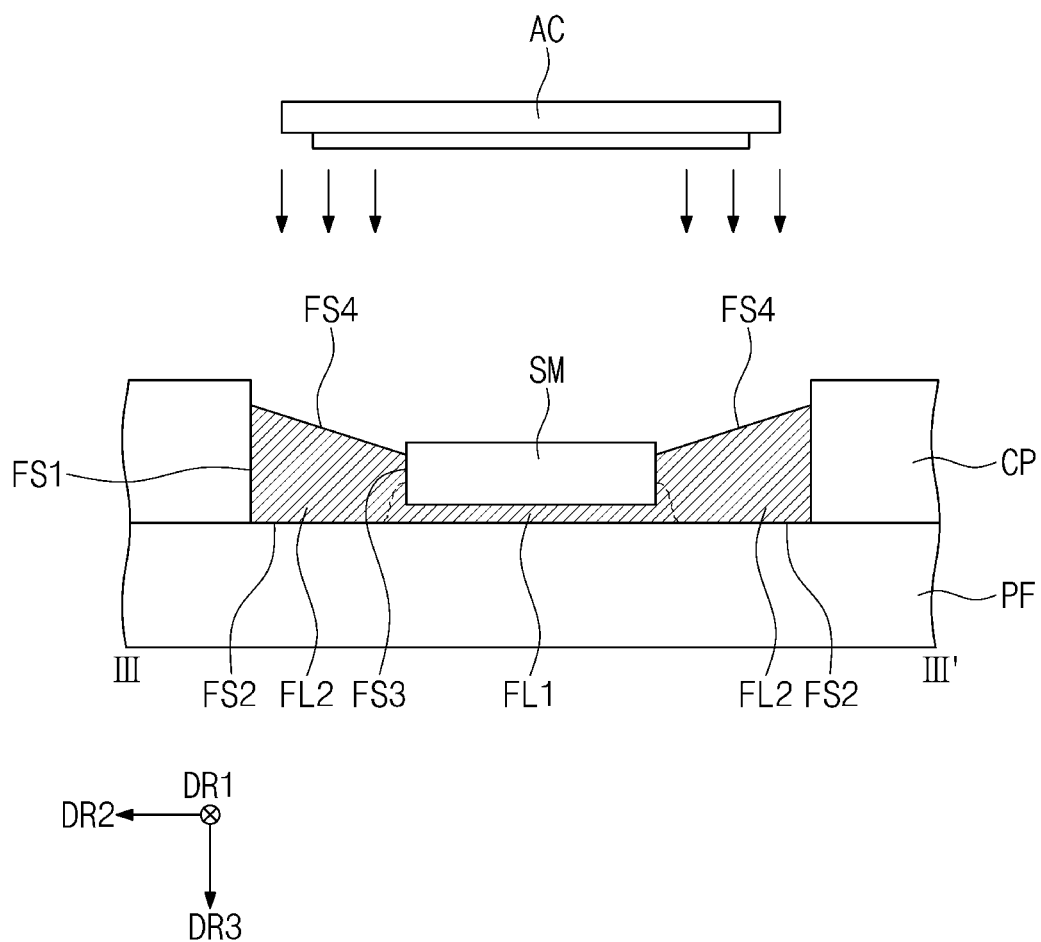
FIG. 10 is a diagram illustrating a step of pressing a second filling layer, according to an embodiment of the present inventive concept.

FIG. 10 is a diagram illustrating a step of pressing the second filling layer FL2, according to an embodiment of the present inventive concept.

Referring to FIG. 10, the curing of the first and second filling layers FL1 and FL2 may be finished after the emission of the second UV ray.

In the case where the second filling layer FL2 has a high thixotropic property, the second filling layer FL2 may have a low spreadability, and in this case, bubbles may be formed in the second filling layer FL2. In such a case, if a highly-intense external light (e.g., solar light) of about 10,000 Lux or higher is incident onto the display panel DP, the external light may pass through the display panel DP and may be output to a region below the display panel DP. The output external light may be reflected by the air gap or bubbles and may propagate toward a region on the display panel DP, and in this case, a user may recognize a fraction of the external light reflected by the air gap or bubbles. Furthermore, in the case where the reflected light is recognized when an image is displayed on the display panel DP, the reflected light may affect image characteristics (e.g., resolution, color, or texture) and may deteriorate the display quality of the electronic device ED.

To avoid the bubble issue in the second filling layer FL2, an autoclave module AC may be placed on the sensor module SM and the fourth surface FS4 of the second filling layer FL2 to further perform an autoclave process, as shown in FIG. 10.

The autoclave module AC may be configured to expose the second filling layer FL2 to an environment of a relatively high temperature and relatively high pressure. For example, the autoclave module AC may be configured such that the second filling layer FL2 is placed at a process temperature of about 25° C. to about 60° C. and a process pressure of about 1 atm to about 5 atm for a predetermined amount of time (e.g., about 5 minutes) or at a process temperature of about 60° C. or higher and a process pressure of about 0 atm to about 1 atm for a predetermined amount of time (e.g., about 5 minutes).

As a result of the autoclave process, the bubbles may be removed from the second filling layer FL2.

In the case where the second filling layer FL2 includes a material having a Newtonian liquid property, it may have a low thixotropic property, and in this case, the autoclave process may be omitted.

According to an embodiment of the present inventive concept, to remove an air gap formed in an open portion of a cover panel, a second filling layer, which is disposed between the cover panel and a sensor module, and a first filling layer, which is disposed between a protection film and the sensor module, may be formed through the same process, and in this case, it may be possible to simplify a fabrication process of an electronic device.

In addition, an air gap may be prevented from being formed between the cover panel and the sensor module, and thus, it may be possible to prevent an external light from being reflected or refracted by the air gap. As a result, it may be possible to prevent quality of an image, which is displayed through a display module, from deteriorating.

While the present inventive concept has been described with reference to embodiments thereof, it will be understood by those of ordinary skill in the art that various changes in form and details may be made thereto without departing from the spirit and scope of the present inventive concept.

What is claimed is:

1. A method of fabricating an electronic device, comprising:
   fabricating a display module including a display panel, a protection film disposed on the display panel, and a cover panel disposed on the protection film, wherein the cover panel has an open portion partially exposing the protection film;
   forming a first resin on a first region of the open portion;
   forming a second resin on a second region, which is adjacent to the first region;
   emitting a first UV ray to the first and second resins;
   placing a sensor module on the first resin;
   pressing the sensor module such that the first and second resins fill the first and second regions and a first filling layer and a second filling layer in the first region and the second region, respectively, are formed; and
   emitting a second UV ray, which has an intensity different from that of the first UV ray, to the second filling layer in the second region to cure the second filling layer.

2. The method of claim 1, wherein the first and second resins exhibit substantially the same curing performance.

3. The method of claim 2, wherein the first and second resins comprise the same material as each other.

4. The method of claim 1, wherein each of the first and second resins is a UV delay curable resin.

5. The method of claim 4, wherein the first and second resins comprise epoxy or silicone.

6. The method of claim 1, wherein the second UV ray has an intensity higher than that of the first UV ray.

7. The method of claim 6, wherein the first UV ray has an intensity of about 200 $mJ/cm^3$ to about 2000 $mJ/cm^3$, and the second UV ray has an intensity of about 4000 $mJ/cm^3$ or higher.

8. The method of claim 1, further comprising exerting a specific pressure on the second filling layer, after the emitting of the second UV ray to the second filling layer to cure the second filling layer.

9. The method of claim 8, wherein the exerting of the specific pressure on the second filling layer comprises exerting a pressure of about 1 atm to about 5 atm on the second filling layer at a process temperature of about 25° C. to about 60° C.

10. The method of claim 8, wherein the exerting of the specific pressure on the second filling layer comprises exerting a pressure of about 0 atm to about 1 atm on the second filling layer at a process temperature of about 60° C. or higher.

11. The method of claim 1, wherein the forming of the first and second resins is performed such that the first and second resins are formed to be spaced apart from each other.

12. The method of claim 11, wherein the second filling layer, which is cured by the second UV ray, and the first filling layer are connected to form a single resin layer.

13. The method of claim 1, wherein the second filling layer comprises a first surface, which is disposed on an inner side surface of the open portion of the cover panel, a second surface, which is disposed on a rear surface of the protection film, a third surface, which is disposed on a side surface of the sensor module, and a fourth surface, which is opposite to the second surface.

14. The method of claim 13, wherein the fourth surface of the second filling layer has an inclined surface profile.

15. The method of claim 13, wherein the fourth surface of the second filling layer has a structure that is concavely curved toward the protection film.

16. The method of claim 1, wherein the sensor module comprises a fingerprint recognition sensor that is configured to recognize a fingerprint by using an ultrasonic wave.

17. The method of claim 16, wherein, when a frequency of the ultrasonic wave sent to the fingerprint recognition sensor is about 1 MHz to about 100 MHz, each of the first and second filling layers has a modulus of about 1 GPa or higher.

18. The method of claim 1, wherein each of the first and second resins has a light-blocking property.

19. The method of claim 18, wherein the protection film does not have a light-blocking property.

20. The method of claim 1, wherein the first and second resins are maintained in a liquid state from a point at which the first and second resins are irradiated by the first UV ray to a point at which the pressing of the sensor module occurs.

* * * * *